(12) United States Patent
Wu et al.

(10) Patent No.: US 11,729,996 B2
(45) Date of Patent: Aug. 15, 2023

(54) HIGH RETENTION EMRAM USING VCMA-ASSISTED WRITING

(71) Applicant: International Business Machines Corporation, Armonk, NY (US)

(72) Inventors: Heng Wu, Guilderland, NY (US); Ruilong Xie, Niskayuna, NY (US); Julien Frougier, Albany, NY (US); Bruce B. Doris, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 17/444,174

(22) Filed: Jul. 30, 2021

(65) Prior Publication Data
US 2023/0031589 A1 Feb. 2, 2023

(51) Int. Cl.
| | |
|---|---|
| G11C 16/04 | (2006.01) |
| H10B 61/00 | (2023.01) |
| H10N 50/80 | (2023.01) |
| H10N 50/01 | (2023.01) |
| G11C 11/16 | (2006.01) |

(52) U.S. Cl.
CPC .......... *H10B 61/00* (2023.02); *G11C 11/161* (2013.01); *G11C 11/1675* (2013.01); *H10N 50/01* (2023.02); *H10N 50/80* (2023.02)

(58) Field of Classification Search
CPC .......... G11C 11/16; G11C 11/1675
See application file for complete search history.

(56) References Cited

U.S. PATENT DOCUMENTS

| | | |
|---|---|---|
| 8,481,431 B2 | 7/2013 | Rouh |
| 9,129,691 B2 | 9/2015 | Khalili Amiri |
| 9,355,699 B2 | 5/2016 | Khalili Amiri |
| 9,589,619 B2 | 3/2017 | Lee |
| 9,620,562 B2 | 4/2017 | Katine |
| 9,721,636 B1 | 8/2017 | Bedau |
| 9,768,229 B2 | 9/2017 | Braganca |

(Continued)

OTHER PUBLICATIONS

International Searching Authority, "Notification of International Search Report and Written Opinion or Declaration", International Application No. PCT/EP2022/070959, dated Nov. 28, 2022, 11 pages.

(Continued)

*Primary Examiner* — Pho M Luu
(74) *Attorney, Agent, or Firm* — Michael A Petrocelli

(57) ABSTRACT

An embedded eMRAM device for eFlash replacement including an MTJ pillar located between a top electrode and a bottom electrode for forming an MRAM array. The bottom electrode is disposed above a substrate and surrounded by a first dielectric spacer, while the top electrode is disposed above the MTJ pillar and surrounded by a second dielectric spacer. A bottom metal plate is disposed on opposing sides of the bottom electrode between first and second dielectric layers and is electrically separated from the bottom electrode by the first dielectric spacer. A top metal plate is disposed on opposing sides of the top electrode between third and fourth dielectric layers and is electrically separated from the top electrode by the second dielectric spacer. A bias voltage applied to the top metal plate and the bottom metal plate generates an external electric field on the MTJ pillar for creating a VCMA effect.

20 Claims, 10 Drawing Sheets

(56) References Cited

U.S. PATENT DOCUMENTS

| | | | |
|---|---|---|---|
| 10,102,893 B2 | 10/2018 | Lee | |
| 10,224,368 B2 | 3/2019 | Li | |
| 10,468,456 B2 | 11/2019 | Jacob | |
| 10,534,996 B2 | 1/2020 | Torng | |
| 2014/0177326 A1 | 6/2014 | Doyle | |
| 2014/0198564 A1 | 7/2014 | Guo | |
| 2016/0268499 A1 | 9/2016 | You | |
| 2019/0221736 A1* | 7/2019 | Houssameddine | H10N 50/01 |
| 2020/0035282 A1 | 1/2020 | Lee | |
| 2021/0375987 A1* | 12/2021 | Chuang | H10N 50/80 |
| 2023/0157181 A1* | 5/2023 | Dutta | H10N 50/01 |
| | | | 257/421 |

OTHER PUBLICATIONS

Nozaki et al : "Voltage-induced perpendicular magnetic anisotropy change in magnetic tunnel junctions", Applied Physics Letters, American Institute of Physics, vol. 96, No. 2, Jan. 11, 2010, 3 pages.

Yoda et al: "High-Speed Voltage-Control Sintronics Memory (High-Speed VoCSM)", 2017 IEEE International Memory Workshop (IMW), IEEE, May 14, 2017 (May 14, 2017), 4 pages.

Yoshida et al: "Electrical-field and spin-transfer torque effects in CoFeB/MgO-based perpendicular magnetic tunnel junction", AIP Advances, American Institute of Physics, vol. 6, No. 5, Mar. 8, 2016, 5 pages.

Cai, et al., "MRAM-on-FDSOI Integration: A Bit-cell Perspective," 2018 IEEE Computer Society Annual Symposium on VLSI, 2018, pp. 263-268.

Maciel, et al., "Voltage-Controlled Magnetic Anisotropy MeRAM Bit-Cell over Event Transient Effects", Journal of Low Power Electronics and Applications, vol. 9, No. 15, 2019, 14 pages.

Mason, Martin, "Making New Memories: 22nm eMRAM is Ready to Displace eFlash", Global Foundries, Foundry Files Blog, Aug. 29, 2019, 4 pages, <https://gf.com/blog/making-new-memories-22nm-emram-ready-displace-eflash>.

Nakamura, et al., "Giant Modification of the Magnetocrystalline Anisotropy in Transition-Metal Monolayers by an External Electric Field," Physical Review Letters, vol. 102, No. 18, 187201, 2009, 4 pages.

Ohsawa, et al., "Ultra-High-Efficiency Writing in Voltage-Control Spintronics Memory (VoCSM): The Most Promising Embedded Memory for Deep Learning", IEEE Journal of the Electron Devices Society, vol. 6, Nov. 12, 2018, pp. 1233-1238.

\* cited by examiner

HIGH RETENTION EMRAM USING VCMA-ASSISTED WRITING

BACKGROUND

The present invention generally relates to the field of magnetic storage devices, and more particularly to high retention embedded magnetoresistive random-access memory devices.

Currently, embedded spin-transfer torque (STT) MRAM (eMRAM) is considered a practical replacement for eFlash memory owing to its application and ease of use. Typical problems associated with eFlash, such as endurance and power consumption difficulties (at 28 nm and lower-process), can be avoided with STT-MRAM's seamless inclusion with CMOS, and its voltage schemes. STT-MRAM can be integrated with as few as three additional masks, while eFlash typically requires six to eight additional masks. eMRAM may also simplify hardware and software designs, improve energy efficiency, enhance form factor, and reduce costs of IoT devices simultaneously. However, due to eMRAM's data retention requirements, a high Eb (i.e., the energy barrier between P and AP stable states of the magnetic tunnel junction cell) is needed to preserve data reliability. This may cause undesirably long write times that may particularly affect high speed applications.

SUMMARY

Shortcomings of the prior art are overcome and additional advantages are provided through the provision of a memory device that includes a plurality of MTJ pillars, each MTJ pillar is located below a top electrode and above a bottom electrode for forming an MRAM array, the bottom electrode is disposed above a substrate and surrounded by a first dielectric spacer, the top electrode is disposed above each MTJ pillar and surrounded by a second dielectric spacer, a bottom metal plate is disposed on opposing sides of the bottom electrode between a first dielectric layer and a second dielectric layer, the bottom metal plate is electrically separated from the bottom electrode by the first dielectric spacer, and a top metal plate on opposing sides of the top electrode between a third dielectric layer and a fourth dielectric layer, the top metal plate is electrically separated from the top electrode by the second dielectric spacer, the top metal plate and the bottom metal plate generating an external electric field to each MTJ pillar for creating a voltage-controlled magnetic anisotropy effect. The top metal plate and the bottom metal plate are each electrically connected to metal contacts. A bias voltage is applied on the top metal plate and the bottom metal plate to generate the external electric field and reduce $E_b$.

Another embodiment of the present disclosure provides a memory device that includes a first MRAM array including a first MTJ pillar located below a first top electrode and above a first bottom electrode, the first bottom electrode is disposed above a substrate and surrounded by a first dielectric spacer, the first top electrode is disposed above the first MTJ pillar and surrounded by a second dielectric spacer, a bottom metal plate on opposing sides of the first bottom electrode between a first dielectric layer and a second dielectric layer, the bottom metal plate is electrically separated from the first bottom electrode by the first dielectric spacer, a top metal plate on opposing sides of the first top electrode between a third dielectric layer and a fourth dielectric layer, the top metal plate is electrically separated from the first top electrode by the second dielectric spacer, the top metal plate and the bottom metal plate locally generating an external electric field to the first MTJ pillar for creating a voltage-controlled magnetic anisotropy effect, and a second MRAM array including a second MTJ pillar located below a second top electrode and above a second bottom electrode, the second bottom electrode is disposed above the substrate and surrounded by the first dielectric spacer, the second top electrode is disposed above the second MTJ pillar and surrounded by the second dielectric spacer. The top metal plate and the bottom metal plate are each electrically connected to metal contacts. A bias voltage is applied on the top metal plate and the bottom metal plate to generate the external electric field and reduce $E_b$.

Another embodiment of the present disclosure provides a method of forming a memory device that includes forming a first MRAM array on a substrate, the first MRAM array including a first MTJ pillar located below a first top electrode and above a first bottom electrode, the first bottom electrode is disposed above the substrate and surrounded by a first dielectric spacer, the first top electrode is disposed above the first MTJ pillar and surrounded by a second dielectric spacer, a bottom metal plate on opposing sides of the first bottom electrode between a first dielectric layer and a second dielectric layer, the bottom metal plate is electrically separated from the first bottom electrode by the first dielectric spacer, and a top metal plate on opposing sides of the first top electrode between a third dielectric layer and a fourth dielectric layer, the top metal plate is electrically separated from the first top electrode by the second dielectric spacer, the top metal plate and the bottom metal plate locally generating an external electric field to the first MTJ pillar for creating a voltage-controlled magnetic anisotropy effect. The top metal plate and the bottom metal plate are each electrically connected to metal contacts.

The method further includes applying a bias voltage on the top metal plate and the bottom metal plate to generate the external electric field locally for reducing $E_b$, sending a write current pulse through the first MRAM array using the top electrode and the bottom electrode, and removing the applied bias voltage from the top metal plate and the bottom metal plate to remove the external electric field locally and increase the $E_b$.

The method further includes forming a second MRAM array on the substrate that includes a second MTJ pillar located below a second top electrode and above a second bottom electrode, the second bottom electrode being disposed above the substrate and surrounded by the first dielectric spacer, the second top electrode being disposed above the second MTJ pillar and surrounded by the second dielectric spacer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
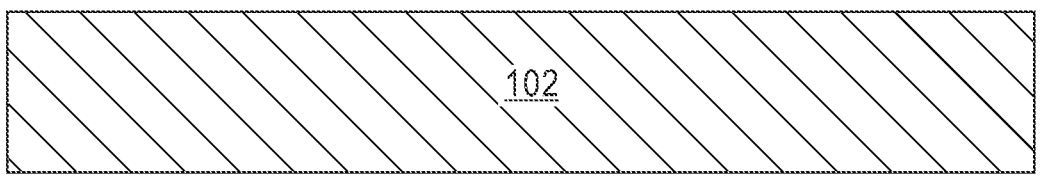
FIG. 1 is a cross-sectional view of a memory device at an intermediate step during a back-end-of-the-line (BEOL) integration process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

STT-MRAM devices are two terminal devices similar to conventional MRAM devices, except that the write current paths pass through the magnetic layers of each memory element. The free layer is set via the spin transfer torque from the spin-polarized current passing through the reference magnetic layer. In an STT-MRAM device, the spin of the electrons is flipped using a spin-polarized current. This effect can be achieved in a magnetic tunnel junction (MTJ) or a spin-valve. The spin-polarized current is created by passing a current through a thin magnetic layer, and then directed into a thinner magnetic layer which transfers the angular momentum to the thin layer which changes its spin. In general, the reference magnetic layer has unchangeable magnetization direction, while the magnetization direction can be changed in the free layer. Therefore, the magnetic field determines the electrical properties of the MTJ. For applications, the conductance difference resulting from the variations of the magnetic field in the ferromagnetic layers is employed. The magnetization orientations ($m_z$) of the two ferromagnetic layers are related to a level of the MTJ resistance: low-resistance ($R_P$) at a parallel state and high-resistance ($R_{AP}$) at an anti-parallel state. These two stable states of the MTJ can be used to represent logic 0 or logic 1.

In STT-MRAMs, the STT effect allows switching the MTJ state by a bidirectional current I when the current is bigger than a critical current $I_{c0}$. It improves the scalability of the circuit with MTJs allowing a denser layout and a simpler design due the use of the same line to write and read the MTJ state. However, a drawback of scaling down using STT is that the thermal stability factor (D) scales down linearly with the area and the increase in retention failures due to thermal instability results in unreliable operations. Thus, a high $E_b$ ($E_b$ being the energy barrier between the P and AP stable states of the MTJ cell) is needed to preserve data reliability. This may cause undesirably long write times that may particularly affect high write speed applications since the switching current of STT is inversely proportional to the write pulse width.

Therefore, embodiments of the present disclosure provide an embedded STT-MRAM (eMRAM) memory device, and a method of making the same, in which an external electric field is introduced to the MTJ cell for eFlash replacement. The external electric field utilizes a voltage-controlled magnetic anisotropy (VCMA) effect to reduce the energy barrier ($E_b$) between AP and P states in the MTJ cell, thus improving the overall MTJ speed. Efficient energy consumption and reduced area can be achieved in the present embodiments by using a voltage-controlled MTJ with an electric field (or a voltage). With the VCMA effect, the electric field is used to switch the MTJ state which occurs by an accumulation of electron charges induced by the electric field changing the occupation of atomic orbitals at the interface. This and the spin-orbit interaction can lead to a change of magnetic anisotropy. Accordingly, embodiments of the present disclosure provides a lower $E_b$ at which the critical current $I_{co}$ can be reduced and the overall MTJ speed can be improved.

More specifically, embodiments of the present disclosure use a top metal plate and a bottom metal plate electrically isolated from the top and bottom electrodes of the MTJ by dielectric materials to introduce the external electric field, thereby generating the VCMA effect on the memory device.

Embodiments by which top and bottom metal plates can be used to generate the VCMA effect and introduce the external electric field to the MTJ cell of the memory device is described in detailed below by referring to the accompanying drawings in FIGS. 1-11B.

Referring now to FIG. 1, a cross-sectional view of a memory device 100 at an intermediate step during a back-end-of-the-line (BEOL) integration process is shown, according to an embodiment of the present disclosure. At this step of the manufacturing process the memory device 100 includes a simplistically depicted substrate 102 containing one or more metal-oxide-semiconductor field-effect transistors (not shown). In this embodiment, the memory device 100 can be an embedded STT-MRAM (eMRAM) device.

Figure 2A:
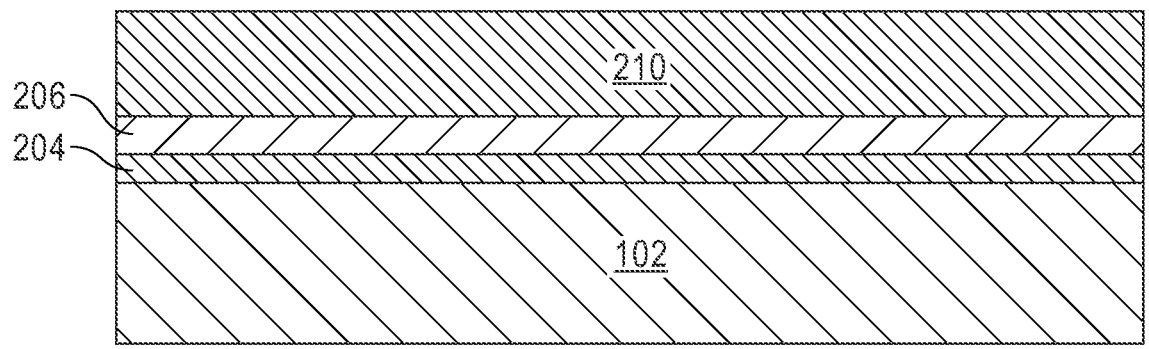
FIG. 2A is a cross-sectional view of the memory device across line X-X depicting forming a bottom metal plate, according to an embodiment of the present disclosure.
Figure 2B:
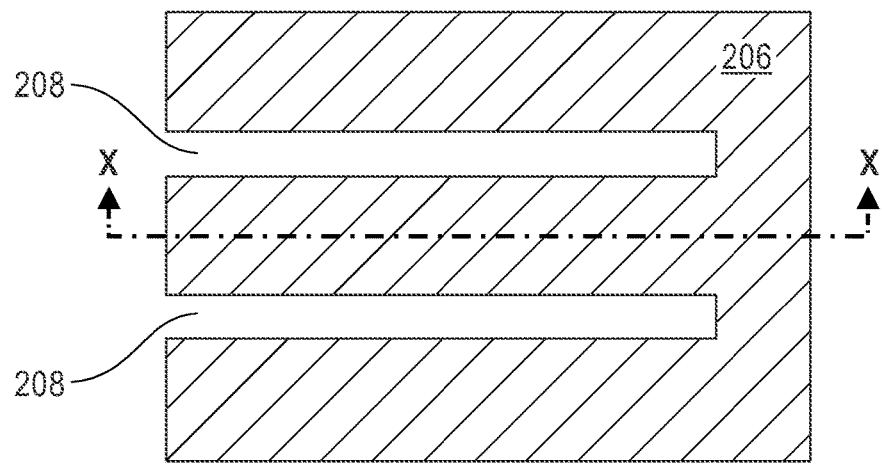
FIG. 2B is a top-down view of the memory device.

Referring now to FIG. 2A, a cross-sectional view of the memory device 100 across line X-X is shown after forming a bottom metal plate 206, according to an embodiment of the present disclosure. In this embodiment, FIG. 2B is a top-down view of the memory device 100.

In this embodiment, prior to forming the bottom metal plate 206, a first dielectric layer 204 is deposited on the memory device 100 above the substrate 102. The first dielectric layer 204 may include, for example, a low-k dielectric material having a dielectric constant, k, in the range of approximately 2.0 to approximately 2.7, which may be deposited directly above the substrate 102 by any suitable deposition process such as, for example, chemical vapor deposition (CVD). A thickness of the first dielectric layer 204 may vary from approximately 20 nm to approximately 80 nm and ranges there between. In an exemplary embodiment, the first dielectric layer 204 may have a thickness varying between 10 nm and 40 nm.

After depositing the first dielectric layer 204, the bottom metal plate 206 is formed in the memory device 100. The bottom metal plate 206 is made of a first conductive material. According to an embodiment, the first conductive material forming the bottom metal plate 206 may include metals such as tungsten, tungsten carbide, copper, titanium, titanium nitride, and the like. In some embodiments, the bottom metal plate 206 may consist of a multilayer stack including one or more layers of metals.

In an exemplary embodiment, the bottom metal plate 206 may have a (vertical) thickness varying from approximately 5 nm to approximately 30 nm, although other thicknesses above or below this range may be used as desired for a particular application.

With continued reference to FIGS. 2A-2B, a patterning process is conducted on the bottom metal plate 206, as illustrated in FIG. 2B. The process of patterning the bottom metal plate 206 consists of steps well-known in the art, which generally include forming a pattern on a photoresist layer (not shown) that is transferred to a hardmask and used to pattern the underlying bottom metal plate 206 via any suitable etching technique. In an exemplary embodiment, an ion beam etch (IBE) or reactive ion etch (RIE) technique may be used to pattern the bottom metal plate 206. As depicted in FIG. 2B, a first plurality of trenches 208 are formed in the bottom metal plate 206 after completing the patterning process.

After patterning the bottom metal plate 206, a second dielectric layer 210 is formed on the memory device 100 above the bottom metal plate 206, as depicted in FIG. 2A. The second dielectric layer 210 may include similar materials and may be formed in analogous ways as the first dielectric layer 210 (FIG. 2A) previously described. A thickness of the second dielectric layer 210 may vary from approximately 20 nm to approximately 80 nm and ranges there between, although other thicknesses above or below this range may be used as desired for a particular application.

Figure 3:
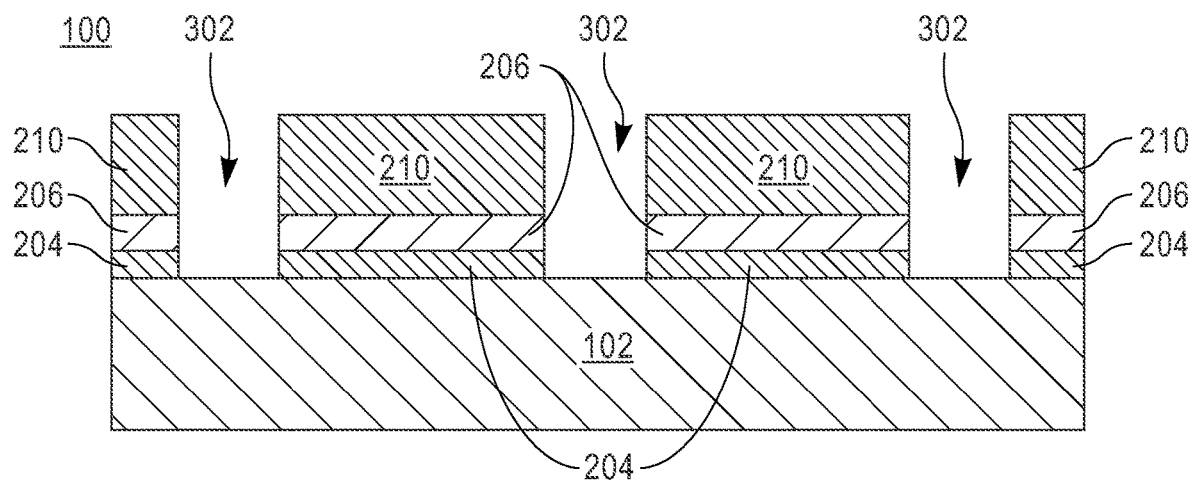
FIG. 3 is a cross-sectional view of the memory device after forming via openings, according to an embodiment of the present disclosure.

Referring now to FIG. 3, a cross-sectional view of the memory device 100 after forming first via openings 302 is shown, according to an embodiment of the present disclosure. The first via openings 302 are formed to electrically connect the memory device 100 to subsequently formed conductive structures.

As known by those skilled in the art, the process of forming the first via openings 302 in the memory device 100 includes depositing a photoresist layer (not shown) above the second dielectric layer 210, exposing a pattern on the photoresist layer, and transferring the exposed pattern to the underlying first dielectric layer 204, bottom metal plate 206 and second dielectric layer 210 to form the first via openings 302, as depicted in the figure. After transferring the pattern and forming the first via openings 302, the photoresist layer can be removed using any photoresist striping method known in the art including, for example, plasma ashing.

Figure 4A:
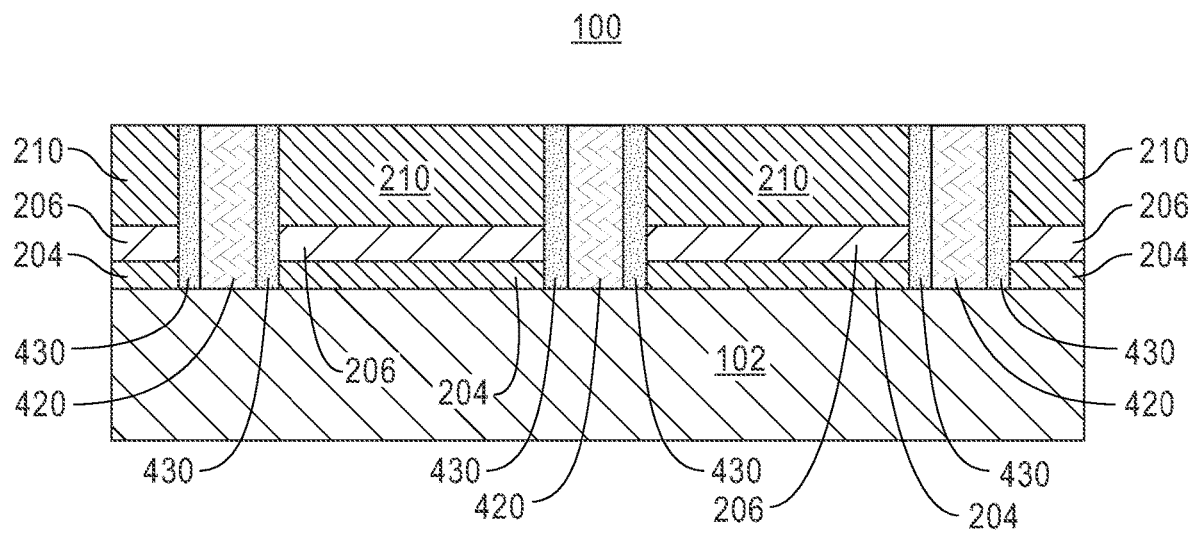
FIG. 4A is a cross-sectional view of the memory device across line X-X after forming first dielectric spacers, according to an embodiment of the present disclosure.

Referring now to FIG. 4A, a cross-sectional view of the memory device 100 across line X-X is shown after forming first dielectric spacers 430 and bottom electrode 420, according to an embodiment of the present disclosure. In this embodiment, FIG. 4B is a top-down view of the memory device 100.

The first dielectric spacers are formed within the first via openings 302 (FIG. 3). The first dielectric spacers 430 may be made from an insulator material such as an oxide, nitride, oxynitride, silicon carbon oxynitride, silicon boron oxynitride, low-k dielectric, or any combination thereof. Standard deposition and etching techniques may be used to form the first dielectric spacers 430. As known by those skilled in the art, the deposited insulator material is removed from all horizontal surfaces of the memory device 100 using, for example, an anisotropic etch. According to an embodiment, a (horizontal) thickness of the first dielectric spacers 430 may vary between approximately 5 nm to approximately 15 nm, although other thicknesses above or below this range may be used as desired for a particular application.

Figure 4B:
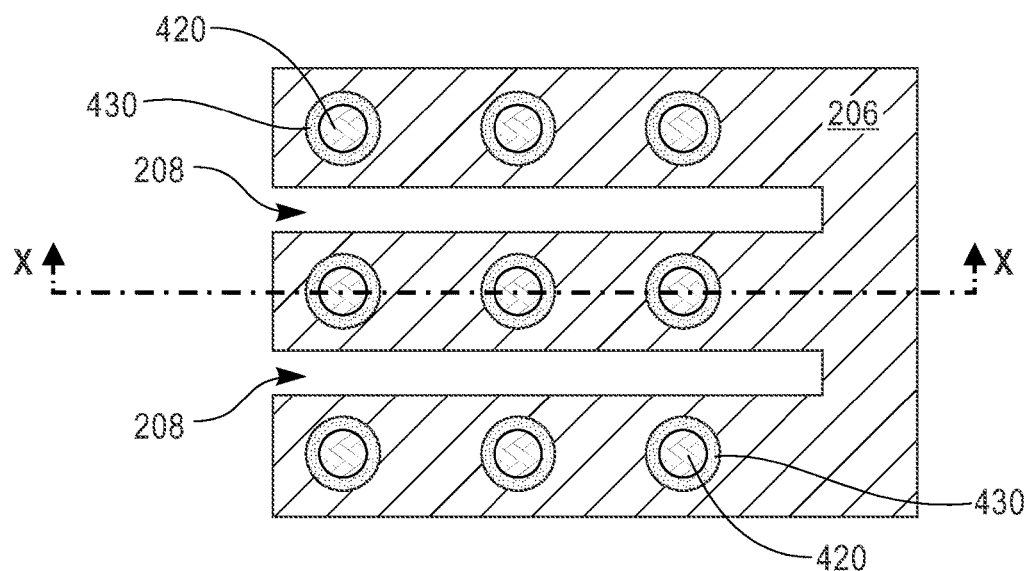
FIG. 4B is a top-down view of the memory device.

With continued reference to FIGS. 4A-4B, after forming the first dielectric spacers 430, the bottom electrode 420 may be deposited on the memory device 100 using standard deposition methods. The conductive material forming the bottom electrode 420 is deposited on a remaining space within the first dielectric spacers 430. Exemplary deposition processes that can be used to form the bottom electrode 420 may include chemical vapor deposition (CVD), plasma enhanced chemical vapor deposition (PECVD), and the like. The bottom electrode 420 is formed above the electrically conductive structures (not shown) in the substrate 102 substantially filling a space between the first dielectric spacers 430, as depicted in the figure. In an exemplary embodiment, the bottom electrode 420 may be composed of a conductive material such as, for example, Ta, TaN, Ti, TiN, Ru, RuN, RuTa, RuTaN, Co, CoWP, CoN, W, WN or any combination thereof.

After forming the bottom electrode 420, a planarization process, such as chemical mechanical polishing (CMP), can be performed to remove excess (overfill) portions of the conductive material forming the bottom electrode 420 from the memory device 100. After the planarization process, top surfaces of the bottom electrode 420 and the second dielectric layer 210 are substantially coplanar.

As depicted in the figures, the first dielectric spacers 430 surround the bottom electrode 420. Thus, the first dielectric spacers 430 electrically separate the bottom electrode 420 from the bottom metal plate 206. Similarly, the first dielectric layer 204 electrically separates the bottom metal plate 206 from the substrate 102, while the second dielectric layer 210 electrically separates the bottom metal plate 206 from subsequently formed conductive structures.

Figure 5A:
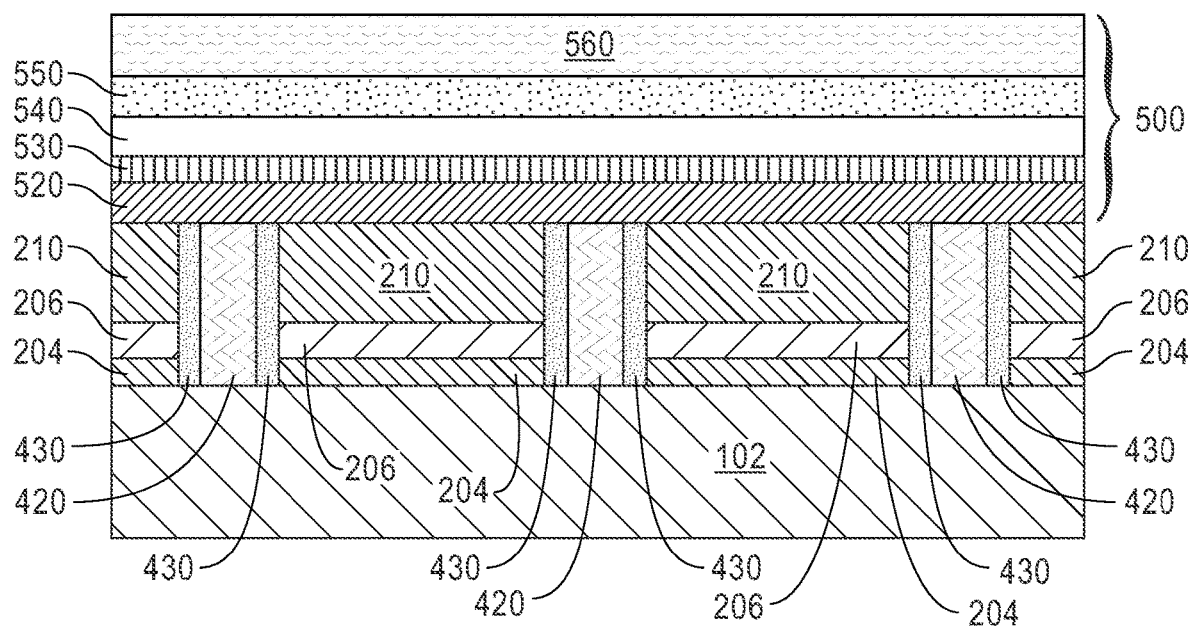
FIG. 5A is a cross-sectional view of the memory device across line X-X after forming an MRAM stack, according to an embodiment of the present disclosure.
Figure 5B:
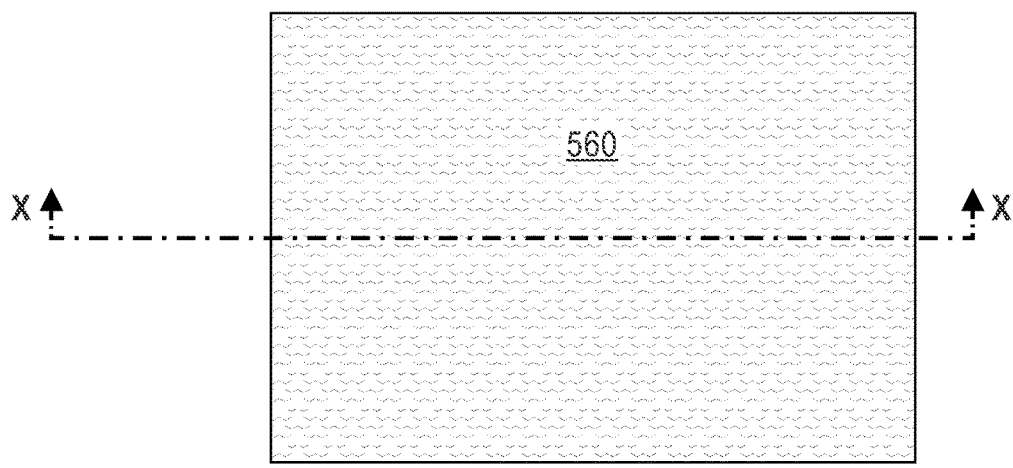
FIG. 5B is a top-down view of the memory device.

Referring now to FIG. 5A, a cross-sectional view of the memory device 100 across line X-X after depositing an MRAM stack 500 is shown, according to an embodiment of the present disclosure. In this embodiment, FIG. 5B is a top-down view of the memory device 100.

According to an embodiment, the MRAM stack 500 is formed above the bottom electrode 420. The MRAM stack 500 may include an MTJ pillar consisting of, at least, a magnetic reference layer 520, a tunnel barrier layer 530, and a magnetic free layer 540. The MRAM stack 500 may further include a conductive hardmask layer 550 located above the MTJ pillar and a patterning hardmask layer 560 located above the conductive hardmask layer 550, as depicted in FIG. 5A. It should be noted that other MTJ configurations are possible for the MTJ pillar of the MRAM stack 500 such as, for example, the magnetic free layer 540 being located at the bottom of the MTJ pillar and the magnetic reference layer 520 being at the top of the MTJ pillar. The various material layers of the MRAM stack 500 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 520 has a fixed magnetization. The magnetic reference layer 520 may be composed of a metal or metal alloy (or a stack thereof) that includes one or more metals exhibiting high spin polarization. In alternative embodiments, exemplary metals for the formation of the magnetic reference layer 520 may include iron, nickel, cobalt, chromium, boron, or manganese. Exemplary metal alloys may include the metals exemplified by the above. In another embodiment, the magnetic reference layer 520 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 530 is composed of an insulator material and is formed at such a thickness as to provide an appropriate tunneling resistance. Exemplary materials for the tunnel barrier layer 530 may include magnesium oxide, aluminum oxide, and titanium oxide, or materials of higher electrical tunnel conductance, such as semiconductors or low-bandgap insulators.

The magnetic free layer 540 may be composed of a magnetic material (or a stack of magnetic materials) with a magnetization that can be changed in orientation relative to the magnetization orientation of the magnetic reference layer 520. Exemplary magnetic materials for the magnetic free layer 540 include alloys and/or multilayers of cobalt, iron, alloys of cobalt-iron, nickel, alloys of nickel-iron, and alloys of cobalt-iron-boron.

It should be noted that some elements and/or features of the memory device 100 are illustrated in the figures but not described in detail in order to avoid unnecessarily obscuring the presented embodiments.

With continued reference to FIGS. 5A-5B, the conductive hardmask layer 550 includes a metallic hardmask typically required to protect the MRAM stack 500 during subsequent etching steps. In an exemplary embodiment, the conductive hardmask layer 550 may be composed of metals such as TaN, TaAlN, WN, and TiN.

According to an embodiment, the patterning hardmask layer 560 located above the conductive hardmask layer 550 can be made of a dielectric material (e.g., silicon dioxide, silicon nitride, silicon carbide, and the like), multiple layers of dielectric materials, and/or an organic planarization layer (OPL). The conductive hardmask layer 550 and the patterning hardmask layer 560 can be formed by any suitable deposition method known in the art. It should be noted that the conductive hardmask layer 550 is not sacrificial, while the patterning hardmask layer 560 is sacrificial, in that the patterning hardmask layer 560 will be removed after completion of the patterning process.

Figure 6A:
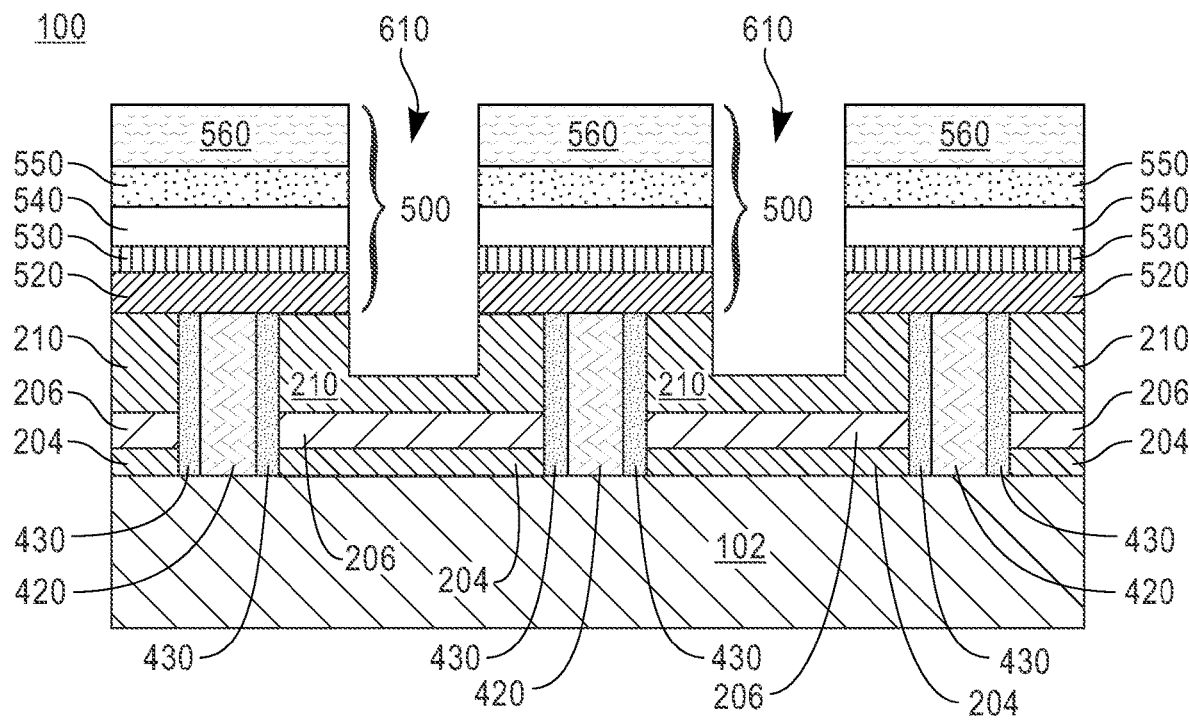
FIG. 6A is a cross-sectional view of the memory device across line X-X after patterning the MRAM stack, according to an embodiment of the present disclosure.
Figure 6B:
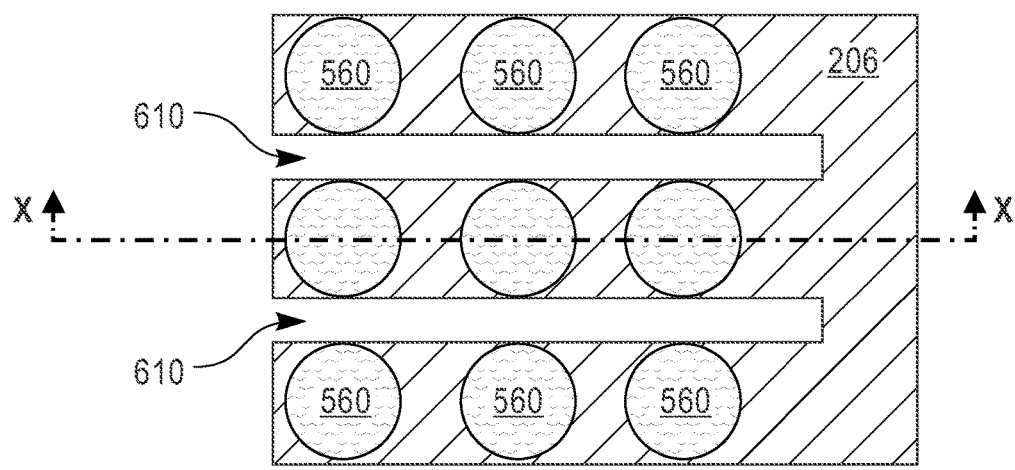
FIG. 6B is a top-down view of the memory device.

Referring now to FIG. 6A, a cross-sectional view of the memory device 100 across line X-X is shown after patterning of the MRAM stack 500, according to an embodiment of the present disclosure. In this embodiment, FIG. 6B is a top-down view of the memory device 100. As can be observed in the figures, the patterned MRAM stack 500 is disposed above the bottom electrode 420 in a way such that a top surface of the bottom electrode 420 contacts a central portion of a bottom surface of the MRAM stack 500.

The process of patterning the MRAM stack 500 consists of steps well-known in the art, which generally include forming a pattern on a photoresist layer (not shown) that is transferred to the patterning hardmask layer 560 and used to pattern the underlying MTJ pillar and conductive hardmask layer 550 via any suitable etching technique. In an exemplary embodiment, an ion beam etch (IBE) technique may be used to pattern the MRAM stack 500. After patterning the MRAM stack 500, recesses 610 are formed in the memory device 100. The recesses 610 extend through a first (top) portion of the second dielectric layer 210. As depicted in FIG. 6A, a second portion of the second dielectric layer 210 remains above the bottom metal plate 206 between the patterned MRAM structures. In this embodiment, the patterning hardmask layer 560 is removed after patterning the MRAM stack 500 using any suitable etching technique.

Figure 7:
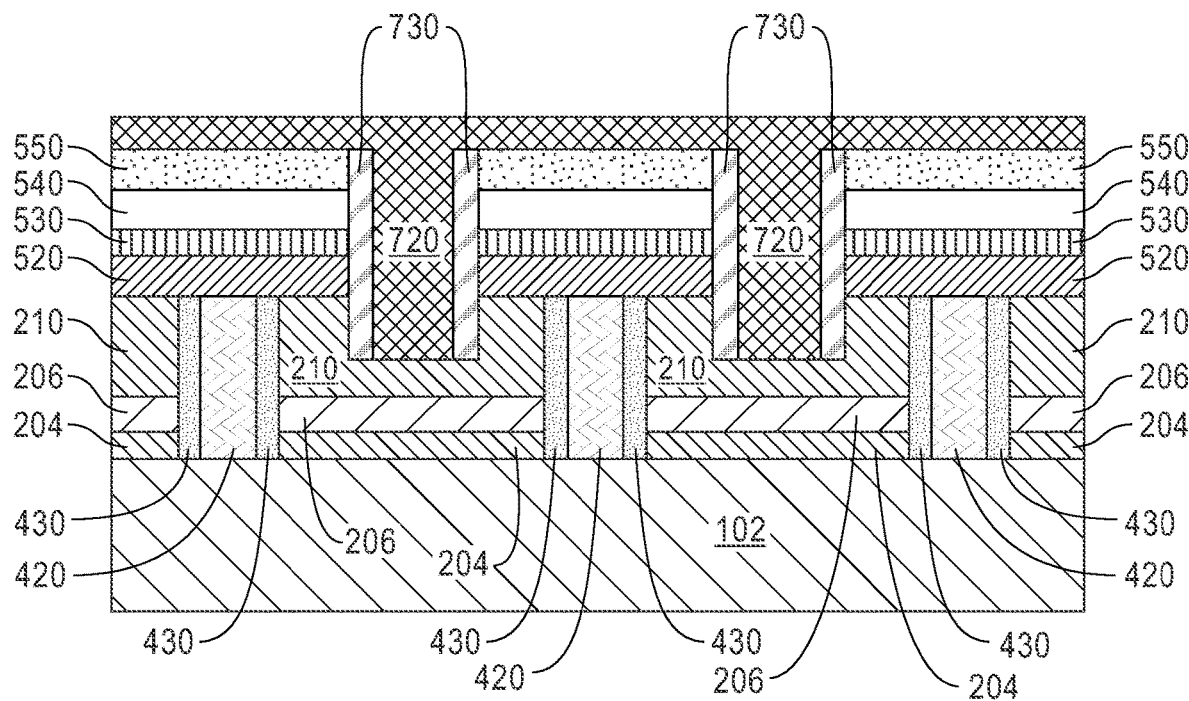
FIG. 7 is a cross-sectional view of the memory device after forming second dielectric spacers and depositing a third dielectric layer, according to an embodiment of the present disclosure.

Referring now to FIG. 7, a cross-sectional view of the memory device 100 after forming second dielectric spacers 730 and depositing a third dielectric layer 720 is shown, according to an embodiment of the present disclosure.

According to an embodiment, the second dielectric spacers 730 are formed within the recesses 610 (FIG. 6A) followed by the deposition of the third dielectric layer 720. The third dielectric layer 720 substantially fills a remaining space within the recesses 610 (FIG. 6A) and extends over a top surface of the conductive hardmask layer 550, as shown in the figure. The third dielectric layer 720 electrically separates the conductive hardmask layer 550 and underlying MTJ layers from subsequently formed electrically conductive structures.

In an exemplary embodiment, the second dielectric spacers 730 are made of the same or similar materials and formed in analogous ways as the first dielectric spacers 430 described above with reference to FIGS. 4A-4B. Similarly, the third dielectric layer 720 is made of similar materials and form in analogous ways as the first and second dielectric layers 204, 210 described above with reference to FIGS. 2A-2B. In some embodiments, after forming the third dielectric layer 720, a planarization process can be conducted on the memory device 100.

Figure 8A:
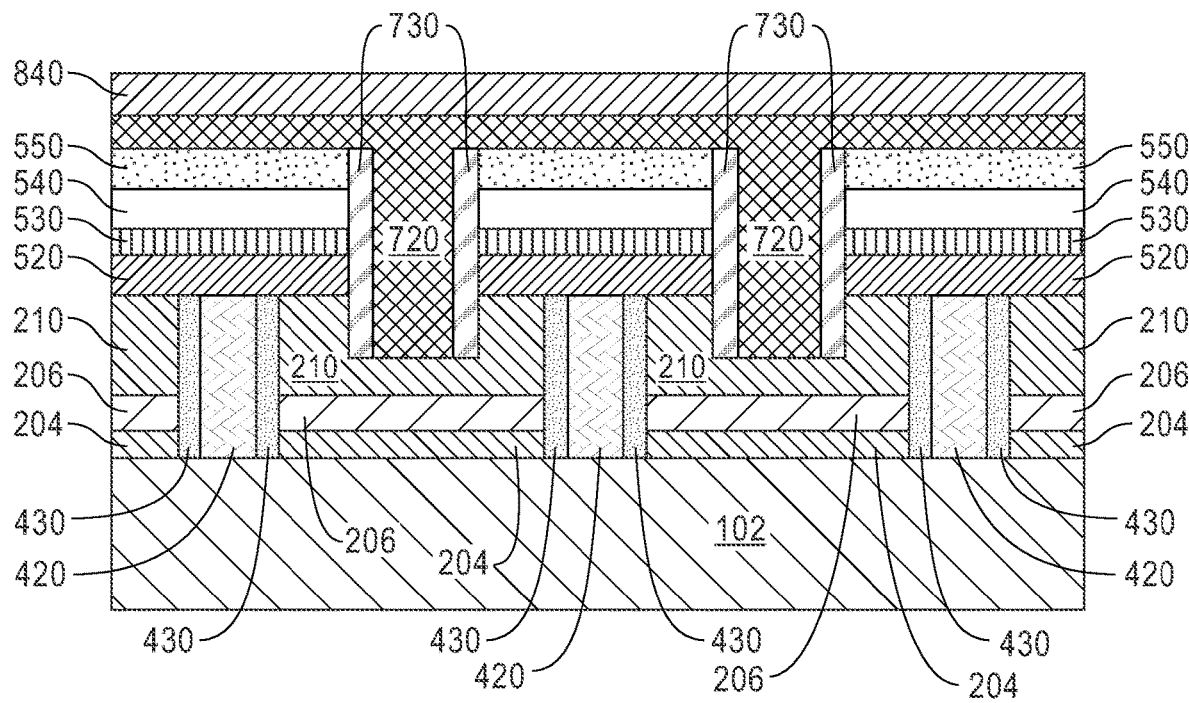
FIG. 8A is a cross-sectional view of a memory device across line X-X after deposition and patterning of a top metal plate, according to an embodiment of the present disclosure.
Figure 8B:
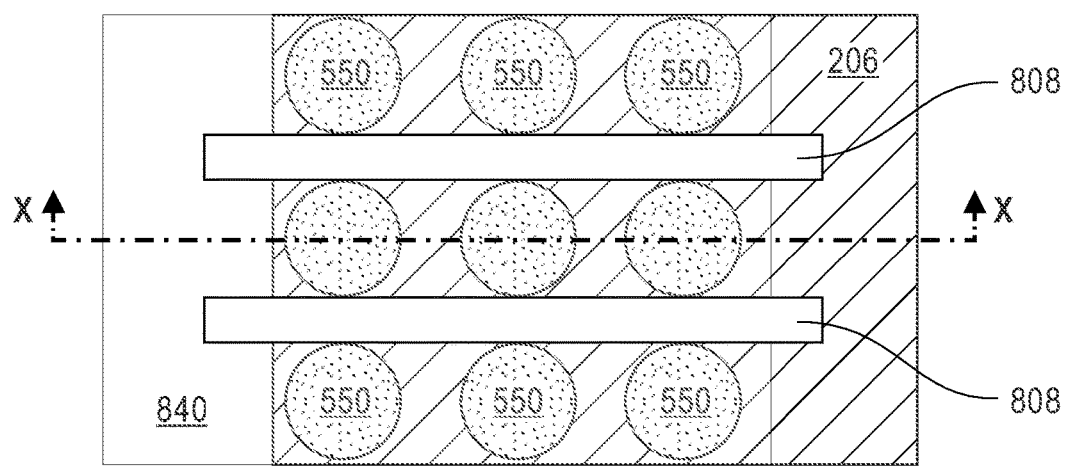
FIG. 8B is a top-down view of the memory device.

Referring now to FIG. 8A, a cross-sectional view of the memory device 100 across line X-X is shown after deposition and patterning of a top metal plate 840, according to an embodiment of the present disclosure. In this embodiment, FIG. 8B is a top-down view of the memory device 100. The top metal plate 840 is formed above the third dielectric layer 720, as depicted in FIG. 8A. The top metal plate 840 is made of a second conductive material similar to the first conductive material forming the bottom metal plate 206 described above with reference to FIGS. 2A-2B.

In an exemplary embodiment, the top metal plate 840 may have a (vertical) thickness varying from 5 nm to approximately 30 nm, although other thicknesses above or below this range may be used as desired for a particular application.

According to an embodiment, a patterning process is conducted on the top metal plate 840, as illustrated in FIG. 8B. The process of patterning the top metal plate 840 consists of steps well-known in the art, which generally include forming a pattern on a photoresist layer (not shown) that is transferred to a hardmask (not shown) and used to pattern the underlying top metal plate 840 via any suitable etching technique. In an exemplary embodiment, an ion beam etch (IBE) or reactive ion etch (RIE) technique may be used to pattern the top metal plate 840. As depicted in FIG. 8B, a second plurality of trenches 808 are formed in the top metal plate 840 after completing the patterning process.

Figure 9:
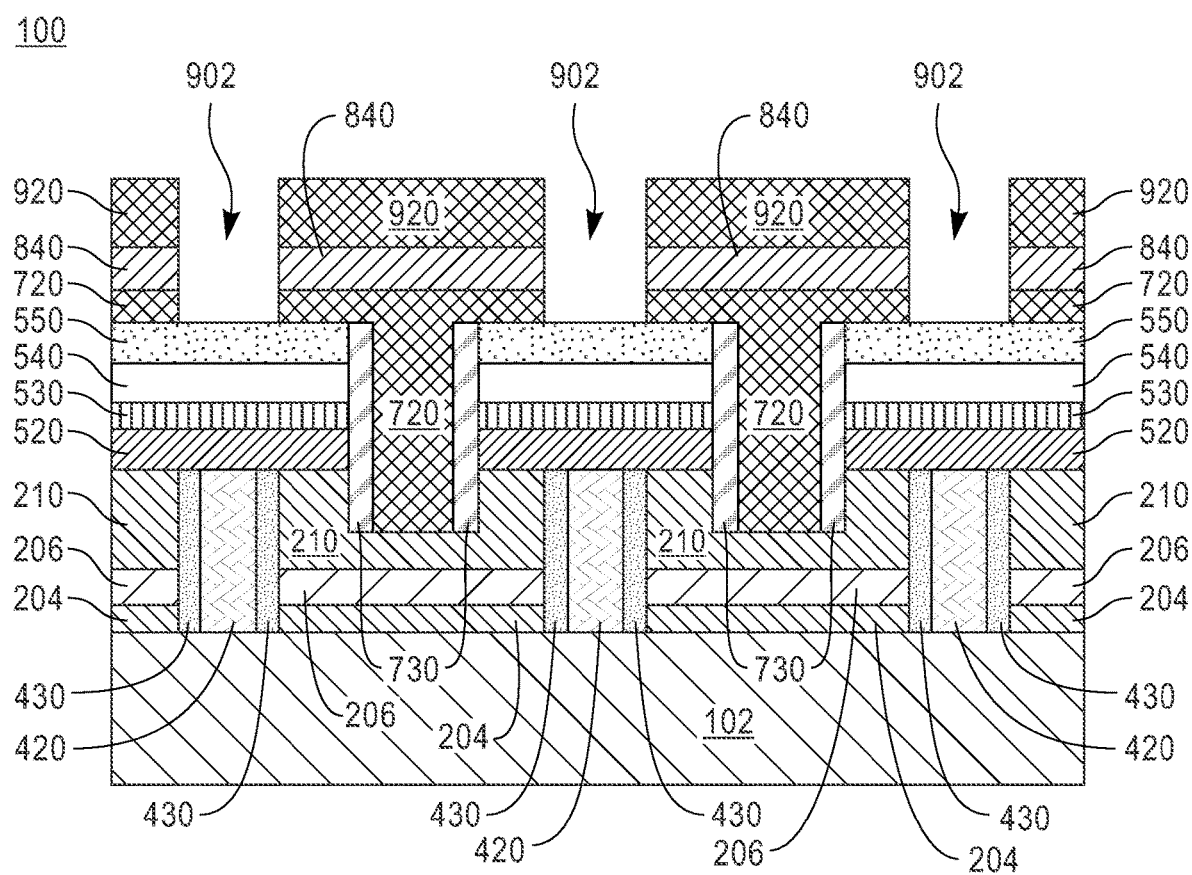
FIG. 9 is a cross-sectional view of the memory device after depositing a fourth dielectric layer and contact patterning, according to an embodiment of the present disclosure.

Referring now to FIG. 9, a cross-sectional view of the memory device 100 is shown after depositing a fourth dielectric layer 920 and forming second via openings 902, according to an embodiment of the present disclosure.

After patterning the top metal plate 840, a fourth dielectric layer 920 is formed on the memory device 100 above the top metal plate 840. In an embodiment, the fourth dielectric layer 920 substantially fills the second plurality of trenches 808 shown in FIG. 8B. The fourth dielectric layer 920 may include similar materials and may be formed in analogous ways as the first, second and third dielectric layers 204, 210 and 720 previously described. As known by those skilled in the art, the process of forming the second via openings 902 in the memory device 100 includes depositing a photoresist layer (not shown) above the second dielectric layer 210, exposing a pattern on the photoresist layer, and transferring the exposed pattern to the underlying fourth dielectric layer 920, top metal plate 840 and third dielectric layer 720 to form the second via openings 902, as depicted in the figure. After transferring the pattern and forming the second via openings 902, the photoresist layer can be removed using any photoresist striping method known in the art including, for example, plasma ashing. As shown in FIG. 9, the second via openings 902 expose a top surface of the conductive hardmask layer 550.

Figure 10A:
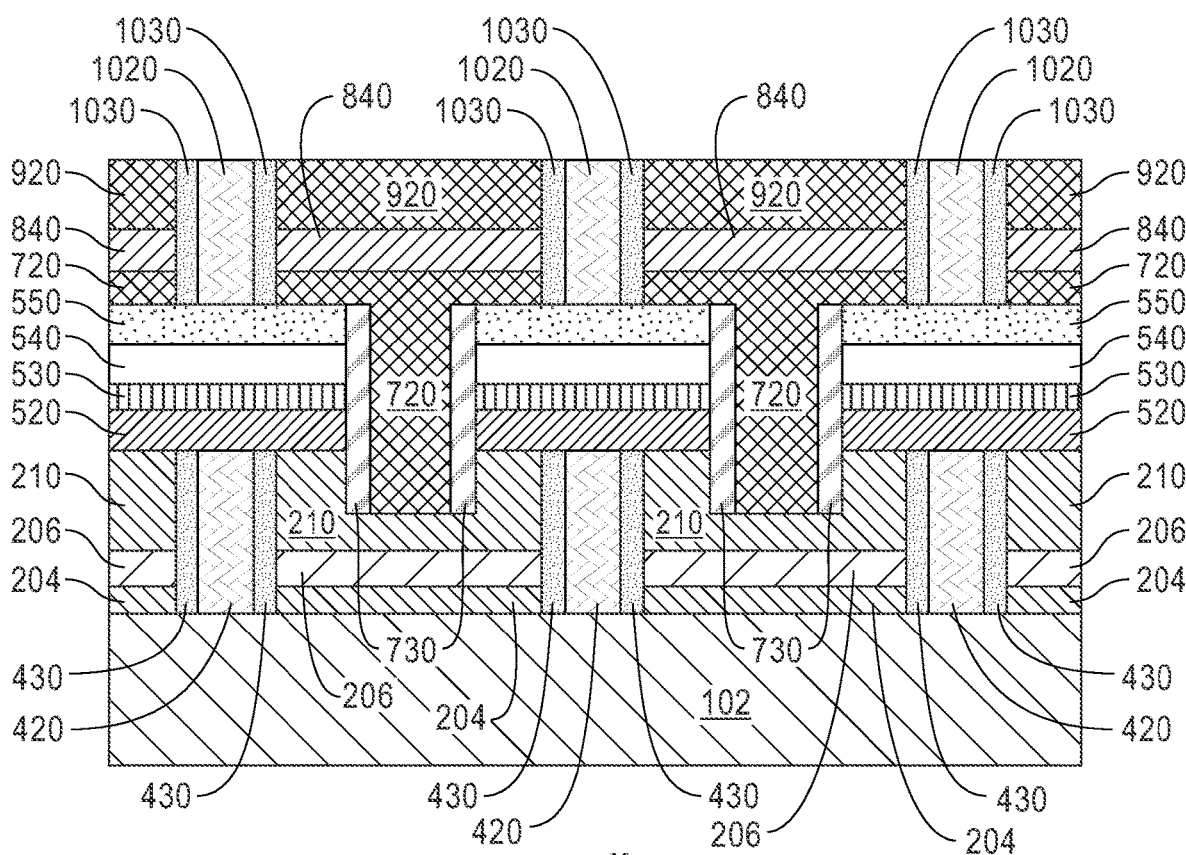
FIG. 10A is a cross-sectional view of the memory device across line X-X after forming third dielectric spacers, according to an embodiment of the present disclosure.
Figure 10B:
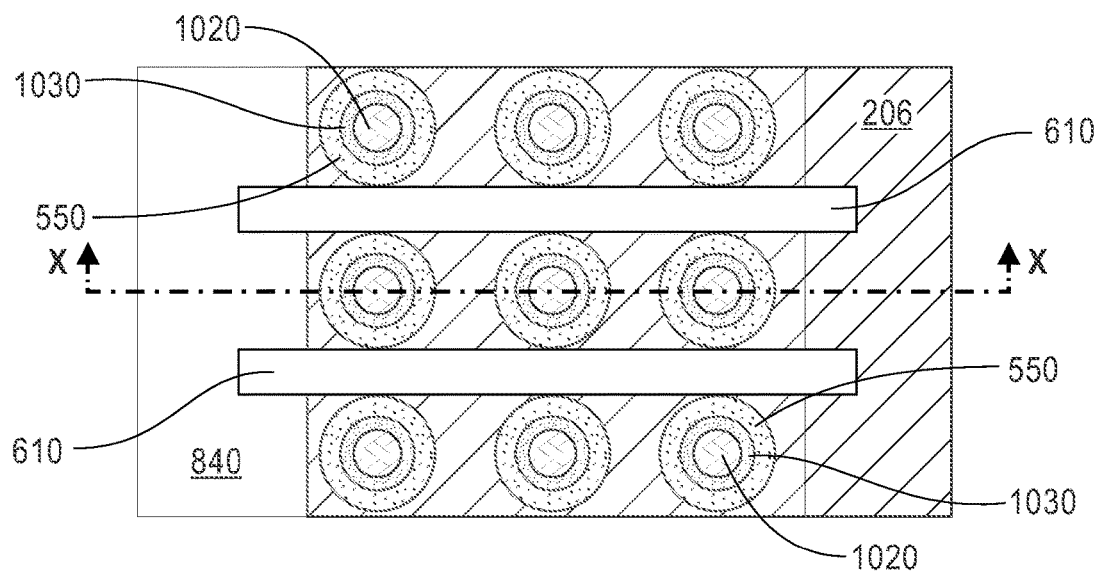
FIG. 10B is a top-down view of the memory device.

Referring now to FIG. 10A, a cross-sectional view of the memory device 100 across line X-X is shown after forming third dielectric spacers 1030 and top electrode 1020, according to an embodiment of the present disclosure. In this embodiment, FIG. 10B is a top-down view of the memory device 100.

Similar to the first dielectric spacers 430 (FIGS. 4A-4B), the third dielectric spacers 1030 are formed within the second via openings 902 (FIG. 9) using methods well-known in the art. After forming the third dielectric spacers 1030, the top electrode 1020 is formed in a remaining space within the second via openings 902 (FIG. 9). The third dielectric spacers 1030 may be formed using similar techniques and materials as in the first dielectric spacers 430 (FIGS. 4A-4B). As known by those skilled in the art, the deposited insulator material forming the third dielectric spacers 1030 can be removed from all horizontal surfaces of the memory device 100 using, for example, an anisotropic etch.

According to an embodiment, a (horizontal) thickness of the third dielectric spacers 1030 may vary between approximately 5 nm to approximately 15 nm, although other thicknesses above or below this range may be used as desired for a particular application.

Similar to the bottom electrode 420 (FIGS. 4A-4B), the top electrode 1020 may be deposited on the memory device 100 using standard deposition methods. For example, a chemical vapor deposition (CVD) process can be used to form the top electrode 1020. In an embodiment, the top electrode 1020 may be composed of a conductive material such as, for example, Ta, TaN, Ti, TiN, Ru, RuN, RuTa, RuTaN, Co, CoWP, CoN, W, WN or any combination thereof.

As illustrated in FIGS. 10A-10B, the third dielectric spacers 1030 surround the top electrode 1020. Thus, the third dielectric spacers 1030 electrically separate the top electrode 1020 from the top metal plate 840.

At this step of the manufacturing process, a planarization process, such as chemical mechanical polishing (CMP), can be performed to remove excess (overfill) portions of the conductive material forming the top electrode 1020 from the memory device 100.

Thus, by forming the top metal plate 206 and the bottom metal plate 840 in isolation from the top and bottom electrodes 420, 1020 of the MRAM array, an external electric field is introduced to the MTJ cell of the MRAM, thereby generating the VCMA effect on the memory device 100 for reducing the energy barrier ($E_b$) between AP and P states of the MTJ cell and improving the overall MTJ speed.

It should be noted that the top metal plate 206 and the bottom metal plate 840 are each electrically connected to (independent) metal contacts (not shown). In some embodiments, the metal contacts may include external metal contacts located outside of the MRAM array. In other embodiments, the metal contacts can be located within the MRAM array region. As may be known by those skilled in the art, when the top metal plate 206 and the bottom metal plate 840 are not connected to the metal contacts (not shown), they would not be functional and the electric field cannot be generated between the top metal plate 206 and the bottom metal plate 840.

Accordingly, embodiments of the present disclosure provide a sequence of operations for a write function that includes: 1) applying a bias voltage on the top metal plate 206 and the bottom metal plate 840 to generate an external electric field locally for reducing $E_b$; 2) sending a write current pulse through the MRAM junction using the top electrode 1020 and the bottom electrode 420; and 3) removing the applied bias voltage from the top metal plate 206 and the bottom metal plate 840 to remove the external electric field locally and increase $E_b$ back for enhanced magnetic state stability and increased retention time.

Figure 11A:
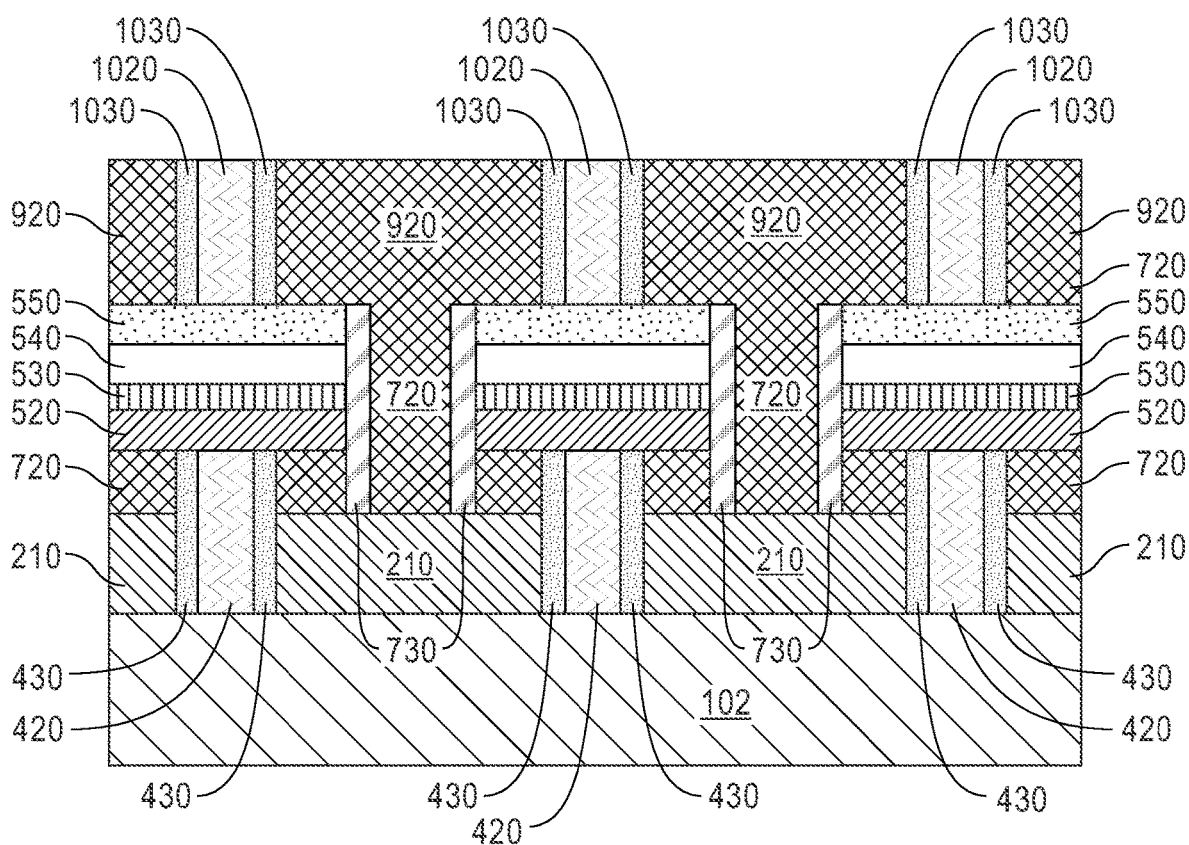
FIG. 11A is a cross-sectional view of the memory device across line X-X after contact metallization, according to another embodiment of the present disclosure.

Referring now to FIG. 11A, a cross-sectional view of the memory device 100 across line X-X after contact metallization is shown, according to another embodiment of the present disclosure. In this embodiment, FIG. 11B is a top-down view of the memory device 100.

Figure 11B:
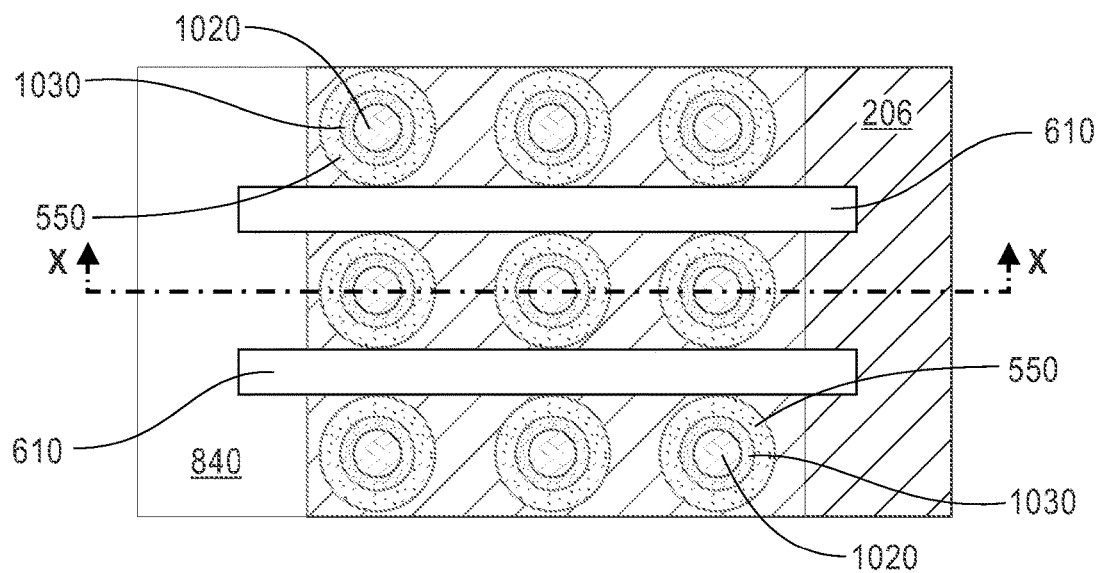
FIG. 11B is a top-down view of the memory device.

Specifically, FIGS. 11A-11B, depict a region of the memory device 100 in which the top metal plate 206 and the bottom metal plate 840 are not integrated in the MRAM array. Thus, additionally or alternatively, the memory device 100 may have one or more MRAM arrays including the top metal plate 206 and the bottom metal plate 840, for example, for eFLASH replacement (as described above), while other MRAM arrays on the same chip may not include the top metal plate 206 and the bottom metal plate 840.

Finally, embodiments of the present disclosure provide a memory device having a top metal plate and a bottom metal plate locally integrated in each MTJ for introducing an external electric field. The top metal plate and the bottom metal plate are electrically isolated from the MTJ cell as well as from the top and bottom electrodes by a plurality of dielectric layers. This configuration may allow reducing write current and tune $E_b$ on-demand via the local electric field created by the top and bottom metal plates which triggers the VCMA effect to modulate $E_b$ at the MTJ level.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a plurality of MTJ pillars, each MTJ pillar located below a top electrode and above a bottom electrode comprising an MRAM array, the bottom electrode being disposed above a substrate and surrounded by a first dielectric spacer, the top electrode being disposed above each MTJ pillar and surrounded by a second dielectric spacer;
a bottom metal plate on opposing sides of the bottom electrode between a first dielectric layer and a second dielectric layer, the bottom metal plate being electrically separated from the bottom electrode by the first dielectric spacer; and
a top metal plate on opposing sides of the top electrode between a third dielectric layer and a fourth dielectric layer, the top metal plate being electrically separated from the top electrode by the second dielectric spacer, the top metal plate and the bottom metal plate generating an external electric field to each MTJ pillar for creating a voltage-controlled magnetic anisotropy effect.

2. The memory device of claim 1, wherein the top metal plate and the bottom metal plate are each electrically connected to metal contacts.

3. The memory device of claim 1, wherein a bias voltage is applied on the top metal plate and the bottom metal plate to generate the external electric field and reduce $E_b$.

4. The memory device of claim 1, further comprising:
a region located between each MRAM array for electrically separating the MRAM arrays, the region being filled with a portion of the third dielectric layer and surrounded by a third dielectric spacer.

5. The memory device of claim 1, wherein each of the plurality of MTJ pillars comprises a magnetic reference layer above the bottom electrode, a tunnel barrier layer above the magnetic reference layer, and a magnetic free layer above the tunnel barrier layer.

6. The memory device of claim 5, wherein each of the plurality of MTJ pillars comprises the magnetic free layer above the bottom electrode, the tunnel barrier layer above the magnetic free layer, and the reference layer above the tunnel barrier layer.

7. The memory device of claim 5, wherein the MRAM array further comprises:
a conductive hardmask layer above the MTJ pillar.

8. The memory device of claim 1, wherein the top metal plate and the bottom metal plate are made of a conductive material comprising at least one of tungsten, tungsten carbide, copper, titanium, and titanium nitride.

9. A memory device, comprising:
a first MRAM array comprising:
a first MTJ pillar located below a first top electrode and above a first bottom electrode, the first bottom electrode being disposed above a substrate and surrounded by a first dielectric spacer, the first top electrode being disposed above the first MTJ pillar and surrounded by a second dielectric spacer;
a bottom metal plate on opposing sides of the first bottom electrode between a first dielectric layer and a second dielectric layer, the bottom metal plate being electrically separated from the first bottom electrode by the first dielectric spacer;
a top metal plate on opposing sides of the first top electrode between a third dielectric layer and a fourth dielectric layer, the top metal plate being electrically separated from the first top electrode by the second dielectric spacer, the top metal plate and the bottom metal plate locally generating an external electric field to the first MTJ pillar for creating a voltage-controlled magnetic anisotropy effect; and
a second MRAM array comprising:
a second MTJ pillar located below a second top electrode and above a second bottom electrode, the second bottom electrode being disposed above the substrate and surrounded by the first dielectric spacer, the second top electrode being disposed above the second MTJ pillar and surrounded by the second dielectric spacer.

10. The memory device of claim 9, wherein the top metal plate and the bottom metal plate are each electrically connected to metal contacts.

11. The memory device of claim 9, wherein a bias voltage is applied on the top metal plate and the bottom metal plate to generate the external electric field.

12. The memory device of claim 9, further comprising:
a region located between the first MRAM array and the second MRAM array for electrically separating the first MRAM array from the second MRAM array, the region being filled with a portion of the third dielectric layer and surrounded by a third dielectric spacer.

13. The memory device of claim 9, wherein the first MTJ pillar comprises a magnetic reference layer above the first bottom electrode, a tunnel barrier layer above the magnetic reference layer, and a magnetic free layer above the tunnel barrier layer, and the second MTJ pillar comprises the magnetic reference layer above the second bottom electrode, the tunnel barrier layer above the magnetic reference layer, and the magnetic free layer above the tunnel barrier layer.

14. The memory device of claim 13, wherein the first MTJ pillar comprises the magnetic free layer above the first bottom electrode, the tunnel barrier layer above the magnetic free layer, and the reference layer above the tunnel barrier layer, and the second MTJ pillar comprises the magnetic free layer above the second bottom electrode, the tunnel barrier layer above the magnetic free layer, and the reference layer above the tunnel barrier layer.

15. The memory device of claim 9, wherein the top metal plate and the bottom metal plate are made of a conductive material comprising at least one of tungsten, tungsten carbide, copper, titanium, and titanium nitride.

16. A method of forming a memory device, comprising:
forming a first MRAM array on a substrate, the first MRAM array comprising:
a first MTJ pillar located below a first top electrode and above a first bottom electrode, the first bottom electrode being disposed above the substrate and surrounded by a first dielectric spacer, the first top electrode being disposed above the first MTJ pillar and surrounded by a second dielectric spacer;
a bottom metal plate on opposing sides of the first bottom electrode between a first dielectric layer and a second dielectric layer, the bottom metal plate being electrically separated from the first bottom electrode by the first dielectric spacer; and
a top metal plate on opposing sides of the first top electrode between a third dielectric layer and a fourth dielectric layer, the top metal plate being electrically separated from the first top electrode by the second dielectric spacer, the top metal plate and the bottom metal plate locally generating an external electric field to the first MTJ pillar for creating a voltage-controlled magnetic anisotropy effect.

17. The method of claim 16, further comprising:
forming a second MRAM array on the substrate, the second MRAM array comprising:
a second MTJ pillar located below a second top electrode and above a second bottom electrode, the second bottom electrode being disposed above the substrate and surrounded by the first dielectric spacer, the second top electrode being disposed above the second MTJ pillar and surrounded by the second dielectric spacer.

18. The method of claim 16, wherein the top metal plate and the bottom metal plate are each electrically connected to metal contacts.

19. The method of claim 16, further comprising:
applying a bias voltage on the top metal plate and the bottom metal plate to generate the external electric field locally for reducing $E_b$;
sending a write current pulse through the first MRAM array using the top electrode and the bottom electrode; and
removing the applied bias voltage from the top metal plate and the bottom metal plate to remove the external electric field locally and increase the $E_b$.

20. The method of claim 17, further comprising:
a region located between the first MRAM array and the second MRAM array for electrically separating the first MRAM array from the second MRAM array, the region being filled with a portion of the third dielectric layer and surrounded by a third dielectric spacer.

* * * * *